United States Patent
Jank (10) Patent No.: US 11,096,298 B2
(45) Date of Patent: Aug. 17, 2021

(54) POWER DISTRIBUTION BUS BAR FOR DISTRIBUTING POWER TO SURFACE MOUNT CONNECTORS

(71) Applicant: Krambu Inc., Dalton Gardens, ID (US)

(72) Inventor: Travis Jank, Coeur d'Alene, ID (US)

(73) Assignee: KRAMBU INC., Dalton Gardens, ID (US)

( * ) Notice: Subject to any disclaimer, the term of this patent is extended or adjusted under 35 U.S.C. 154(b) by 0 days.

(21) Appl. No.: 16/785,223

(22) Filed: Feb. 7, 2020

(65) Prior Publication Data

US 2020/0337169 A1 Oct. 22, 2020

Related U.S. Application Data

(63) Continuation-in-part of application No. 16/391,000, filed on Apr. 22, 2019, now Pat. No. 10,561,036.

(51) Int. Cl.
| | |
|---|---|
| H05K 7/02 | (2006.01) |
| H01R 12/71 | (2011.01) |
| H05K 1/18 | (2006.01) |
| H05K 7/14 | (2006.01) |
| H05K 7/10 | (2006.01) |

(52) U.S. Cl.
CPC .......... H05K 7/026 (2013.01); H01R 12/716 (2013.01); H05K 1/181 (2013.01); H05K 7/10 (2013.01); H05K 7/1405 (2013.01); H05K 7/1492 (2013.01); *H05K 2201/10189* (2013.01); *H05K 2201/10522* (2013.01)

(58) Field of Classification Search
CPC .... H05K 1/14; H05K 1/141–144; H05K 1/18; H05K 1/181–188; H05K 7/1457; H05K 7/1492; H05K 7/02; H05K 7/026; H05K 7/1405; H05K 7/10; G06F 1/184–188; G06F 13/409; H01R 12/716; H01R 12/724; H01R 12/727; H01R 12/7088

USPC .................. 361/752, 775–778, 788, 803
See application file for complete search history.

(56) References Cited

U.S. PATENT DOCUMENTS

| | | | | |
|---|---|---|---|---|
| 5,440,755 A | * | 8/1995 | Harwer | G06F 13/409 710/105 |
| 6,377,471 B1 | * | 4/2002 | Chong, Jr. | G11B 25/043 361/679.33 |
| 6,512,676 B1 | * | 1/2003 | Crapisi | H05K 7/1461 361/752 |
| 6,644,979 B2 | * | 11/2003 | Huang | G06F 1/184 439/60 |
| 7,539,023 B2 | * | 5/2009 | Bulucea | G06F 1/188 361/785 |
| 8,345,439 B1 | * | 1/2013 | Goergen | H05K 7/1458 361/788 |

(Continued)

*Primary Examiner* — Tuan T Dinh
(74) *Attorney, Agent, or Firm* — Zilka-Kotab, PC (57) ABSTRACT

A power distribution bus bar is provided for distributing power to surface mount connectors. In use, the power distribution bus bar includes a circuit board and at least two add-in card connectors each mounted to a first surface of the circuit board. Additionally, at least one power supply connector distributing a power supply to the add-in card connectors is provided. The at least one power supply connector may be mounted to a second surface of the circuit board and connected to the at least two add-in card connectors.

18 Claims, 9 Drawing Sheets

(56) References Cited

U.S. PATENT DOCUMENTS

| | | | | |
|---|---|---|---|---|
| 2002/0090844 A1* | 7/2002 | Kocin | ............... | H05K 7/1444 439/74 |
| 2013/0342968 A1* | 12/2013 | Peterson | ............ | H05K 1/141 361/622 |
| 2016/0073544 A1* | 3/2016 | Heyd | .................. | G06F 1/187 361/679.31 |
| 2016/0149380 A1* | 5/2016 | Dickey | ............ | H05K 7/1457 361/631 |

* cited by examiner

POWER DISTRIBUTION BUS BAR FOR DISTRIBUTING POWER TO SURFACE MOUNT CONNECTORS

RELATED APPLICATIONS

This application is a continuation-in-part of and claims priority to U.S. patent application Ser. No. 16/391,000, filed Apr. 22, 2019, entitled "PERIPHERAL COMPONENT INTERCONNECT EXPRESS BUS BAR," which is herein incorporated by reference for all purposes.

FIELD OF THE INVENTION

The present invention relates to a power distribution bus bar, and more particularly to a power distribution bus bar for distributing power to add-in card connectors.

BACKGROUND

Current power delivery systems (such as rack-mounted power systems) are limited by size constraints, both based on a size of the chassis, as well as a size of the individual components housed within the chassis. Additionally, power cables used to connect add-in cards may both impede air flow and require a greater chassis height. For example, typical add-in cards may connect to power cables on top of the add-in cards, thereby adding to the minimum height requirement of the individual components. Generally, as the chassis size decreases (for example from a 4 rack unit (U) to a 3 U, etc.), the ability to include add-in cards decreases as well, as height requirements of the power cables connecting to the add-in cards would increase the minimum chassis height requirement. As such, typical add-in card assembly, as well as connection systems (e.g. power cables), pose an issue in providing chassis systems that are more compact in size, and which are more space and resource (e.g. power delivery connection, etc.) efficient.

Further, current systems connect add-in cards via individual cables, which may increase the volume size of the individual components. As such, current systems do not allow to power multiple add-in cards by a bus bar in lieu of power cables.

There is thus a need for addressing these and/or other issues associated with the prior art.

SUMMARY

A power distribution bus bar is provided for distributing power to surface mount connectors. In use, the power distribution bus bar includes a circuit board and at least two add-in card connectors each mounted to a first surface of the circuit board. Additionally, at least one power supply connector distributing a power supply to the add-in card connectors is provided. The at least one power supply connector may be mounted to a second surface of the circuit board and connected to the at least two add-in card connectors.

The present disclosure further discloses a system comprising a first bus bar which comprises a first circuit board, at least two first add-in card connectors attached to the first circuit board, each of the at least two first add-in card connectors configured to be connected to a respective add-in card, and at least one power connector attached to the first circuit board and connected to the at least two first add-in card connectors, and configured to receive power and distribute the power to the at least two first electrical interface surface connectors. Additionally, a second bus bar comprises a second circuit board, and at least two second add-in card connectors attached to the second circuit board, each of the least two second add-in card connectors configured to be connected to a respective second additional add-in card. Further, at least one single right angle connector to connect the second bus bar to the first bus bar.

The present disclosure also discloses a system comprising a first bus bar which comprises a first circuit board, at least two first add-in card connectors attached to the first circuit board, each of the at least two first add-in card connectors configured to be connected to a respective first add-in card, and at least one first power connector attached to the first circuit board and connected to the at least two first add-in card connectors, and configured to receive power and distribute the power to the at least two first electrical interface surface connectors. A second bus bar comprises a second circuit board, at least two second add-in card connectors attached to the second circuit board, each of the at least two second add-in card connectors configured to be connected to a respective second add-in card, and at least one second power connector attached to the second circuit board and connected to the at least two second add-in card connectors, and configured to receive power and distribute the power to the at least two second electrical interface surface connectors. Additionally, the system includes a mechanical fastener to attach the first bus bar to the second bus bar. In one embodiment, at least one of the first bus bar or the second bus bar may be temporarily removed such that at least one of the first add-in card or the second add-in card can be changed or swapped.

In a first embodiment, the circuit board may be configured for at least one of a 1 rack unit (U) of 1.75 inches height chassis configuration, a 2 U of 3.5 inches height chassis configuration, or a 3 U of 5.25 inches height chassis configuration. Additionally, the circuit board may be a printed circuit board (PCB).

In a second embodiment (which may or may not be combined with the first embodiment), at least one of the at least two add-in card connectors may include at least one of a 6-pin connector, an 8-pin connector, a peripheral component interconnect express (PCIe) connector, a M.2 PCIe 4x express connection, a blade slot connector, or an in slot connector. Additionally, the at least two add-in card connectors may be attached to the circuit board without mechanical fasteners or clips (including but not limited to mount connector clips 207, 307, and/or 507). The at least two add-in card connectors may include at least seven add-in card connectors. The at least two add-in card connectors may be attached to a first side of the circuit board, and the at least one power connector may be attached to the first side of the circuit board. Additionally, the at least two add-in card connectors may be attached to a first side of the circuit board, and the at least one power connector may be attached to a second side of the circuit board, the second side being different than the first side.

In a third embodiment (which may or may not be combined with the first and/or second embodiments), the bus bar may include at least one of mechanical fasteners or clips (including but not limited to mount connector clips 207, 307, and/or 507) for securing the bus bar to a chassis. Additionally, the bus bar may include at least one of mechanical fasteners or clips for securing the respective add-in card. The respective add-in card may include at least one of a processor, a graphics card, a central processing unit (CPU), a field programmable gate array (FPGA), a graphics processing unit (GPU), a hard drive, a solid state drive (SSD), an application specific integrated circuit (ASIC), a system on a chip (SoC), or an application-specific standard product (ASSP). The respective add-in card may be at least one of Advanced Technology eXtended (ATX) compatible or peripheral component interconnect express (PCIe) compatible.

In a fourth embodiment (which may or may not be combined with the first, second, and/or third embodiments), the at least one power connector may include a 12-volt connector, and/or a 24-pin power connector. Additionally, each power connector of the at least one power connector may be connected to a maximum of four add-in card connectors of the at least two add-in card connectors. The at least one power connector may be surface mounted to the circuit board. Additionally, the at least one power connector may be configured to a particular at least one of voltage, impedance, or current.

DETAILED DESCRIPTION

Figure 1:
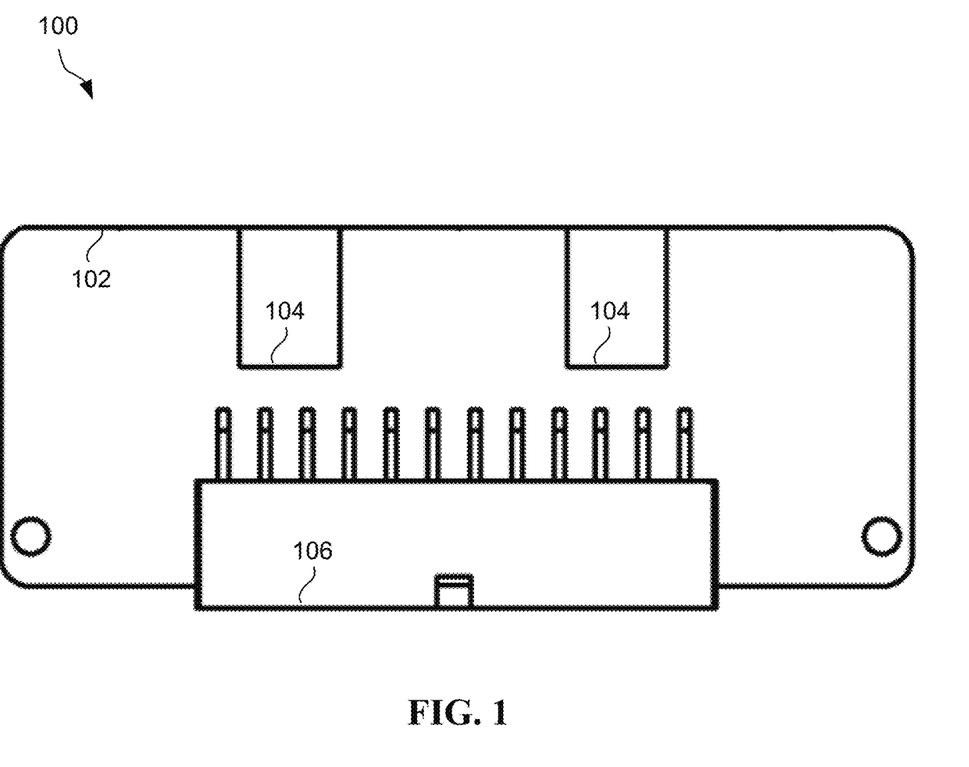
FIG. 1 illustrates a bus bar with surface mounted connectors, in accordance with one embodiment.

FIG. 1 illustrates a bus bar 100 with surface mounted connectors, in accordance with one embodiment.

As shown, the bus bar includes a circuit board 102. Additionally, at least two add-in card connectors 104 are attached to the circuit board 102, each of the at least two add-in card connectors 104 configured to be connected to a respective add-in card.

Further, at least one power connector 106 is attached to the circuit board 102 and connected to the at least two add-in card connectors 104, and is configured to receive power and distribute the power to the at least two electrical interface surface connectors 104.

In one embodiment, the circuit board 102 may be configured for at least one of a 1 rack unit (U) of 1.75 inches height chassis configuration, a 2 U of 3.5 inches height chassis configuration, a 3 U of 5.25 inches height chassis configuration, or any larger height chassis configuration. Additionally, the circuit board 102 may be a printed circuit board (PCB).

In another embodiment, at least one of the at least two add-in card connectors 104 may include at least one of a 6-pin connector, an 8-pin connector, or a peripheral component interconnect express (PCIe) connector. Additionally, any PCIe connector (with any number of pins) may be used to connect the add-in card connectors 104 to the circuit board 102. The add-in card connectors 104 are attached to the circuit board 102 by mounting the connector 104 to the surface of the circuit board 102.

Additionally, the at least two add-in card connectors 104 may be attached to the circuit board 102 without mechanical fasteners or clips. Conventional 6-pin connectors may include a clip (including but not limited to mount connector clips 207, 307, and/or 507) to fasten the connector to an add-in card, whereas the present disclosure includes add-in card connectors 104 that are free of clips or mechanical fasteners. Additionally, the add-in card connectors 104 are shorter in size than conventional 6-pin connectors.

In one embodiment, the at least two add-in card connectors 104 may include at least seven add-in card connectors (not shown in FIG. 1). Additionally, at least one and up to four add-in card connectors 104 may be attached to each power connector 106 (such as a 24-pin Advanced Technology eXtended (ATX) compatible connector). Each power connector 106 may receive power via a cable pulling power from a riser board, a motherboard, a power supply, etc., and supply the power to each of the add-in card connectors 104.

In another embodiment, power requirements met by add-in card connectors 104 and/or the power connector 106 may include 12 volts (V) of power per each electrical interface surface mount connector 104 at a current of about 6 AMPs (amperes) (between 5-7 AMPs) connected through the conductors and ground planes embedded into the circuit board 102 to the power connector 106 (such as a 24-pin ATX compatible connector).

Moreover, in another embodiment, the at least one power connector may include a 12-volt connector, and/or a 24-pin power connector. Additionally, each power connector of the at least one power connector may be connected to a maximum of four add-in card connectors (assuming the power connector is a 24-pin connector) of the at least two add-in card connectors. Of course, if an alternative pin connector (8 pin, 15 pin, etc.) is used, the number of pins of the power connector may dictate the number of permitted connections to add-in card connectors.

Still yet, in one embodiment, the bus bar may include at least one of mechanical fasteners or clips (including but not limited to mount connector clips 207, 307, and/or 507) for securing the bus bar to a chassis. Additionally, the bus bar may include at least one of mechanical fasteners or clips for securing the respective add-in card. For example, instead of using clips on the electrical interface surface mount connector 104, after the bus-bar is adjoined to multiple add-in cards (which may be seated into a riser board or motherboard), mechanical fasteners and/or clips associated with the bus bar are used to secure the bus bar in a chassis and prevent movement and/or shifting of the add-in cards.

In one embodiment, the at least two add-in card connectors 104 may be attached to a first side of the circuit board 102, and the at least one power connector 106 may be attached to the first side of the circuit board 102. Additionally, the at least two add-in card connectors 104 may be attached to a first side of the circuit board 102, and the at least one power connector 106 may be attached to a second side of the circuit board 102, the second side being different than the first side.

For example, in some embodiments, the bus bar may include one continuous circuit board 102 with all components (including the electrical interface surface mount connector 104 and the power connector 106) on the upper side of the circuit board 102 (such as a Printed Circuit Board (PCB)). In another embodiment, the bus bar may include the add-in card connectors 104 (such as a 6-pin connector) on a first side of the circuit board 102, and the power connector 106 (such as a 24-pin 12V power connector) may be on the other side of the circuit board 102.

In yet another embodiment, the bus bar may include multiple circuit boards 102, each circuit board 102 functioning as a section that accommodates two or more add-in cards (connected to a respective electrical interface surface mount connector 104). Additionally, the multiple circuit boards 102 may include a combined number of at least four add-in cards or more.

In one embodiment, the respective add-in card may include at least one of a processor, a graphics card, a central processing unit (CPU), a field programmable gate array (FPGA), a graphics processing unit (GPU), a hard drive, or a solid state drive (SSD). The respective add-in card may be Advanced Technology eXtended (ATX) compatible. Additionally, the add-in card may include an ATX-compatible full height (of about 4.3 inches) full length (of about 8.25 inches) piece of hardware with different computing capabilities.

The present disclosure provides a solution to fitting a full height add-in card into a 3 U chassis, as the use of a bus bar with surface mounted connectors may decrease the height requirement for ATX-compatible add-in cards. Additionally, the bus bar may enable the ability to maximize the amount of computation possible per cubic volume of hardware, as less space would be required per add-in card due to a lack of cables attached to each of the add-in cards.

In addition, the present disclosure provides a solution to power multiple add-in cards (at least 2) directly with a bus-bar in lieu of power cables. This solution may increase efficiency and airflow within the chassis (which is the basis for cooling the components within the chassis).

Still yet, the at least one power connector 106 may be surface mounted to the circuit board 102. Additionally, the at least one power connector 106 may be configured to a particular at least one of voltage, impedance, or current.

In various embodiments, a system using the bus bar with surface mounted connectors may include at least two bus bars. Each of the bus bars may include a circuit board 102, at least two add-in card connectors 104, and at least one power connector 106. The system may include a mechanical fastener to attach the first bus bar to the second bus bar. In one embodiment, at least one of the at least two bus bars may be temporarily removed such that at least one add-in card can be changed or swapped.

In another embodiment, a system using the bus bar with surface mounted connectors may include at least two bus bars. Each of the bus bars may include a circuit board 102, and at least two add-in card connectors 104. A first bus bar may include at least one power connector 106. The second bus bar may include at least one right angle connector to connect the second bus bar to the first bus bar. Additionally, in one embodiment, the at least one right angle connector may distribute power from the first bus bar to the second bus bar.

In one embodiment, a continuous bus bar may be designed for nineteen add-in cards, which may be separated into segments of two (or three) connected add-in cards, and all of the segments may be connected to create a continuous bus bar. Such a continuous bus bar may allow for removal of just one segment (or any number of separate segments) to allow access to two (or three) add-in cards. The removal may allow for easier access to individual add-in cards for maintenance purposes.

In another embodiment, two or more bus bars may each be of a full length, and an additional power connection point may be provided to bridge the two bus bars such that power may be provided to a graphics card with two power input locations. In such an embodiment, the bus bars may be arranged in parallel (such as but not limited to 4-6 inches apart). Additionally, the two bus bars may be connected via a conductive path or trace located on a riser board to which the add-in cards are mounted. The conductive path or trace may include a first cable that is connected from a first bus bar to the riser board, and a second cable that is connected from the riser board to a second bus bar. Of course, it is to be appreciated that the two bus bars may be directly connected (rather than through a riser board), and that more than two bus bars may be arranged in parallel.

More illustrative information will now be set forth regarding various optional architectures and uses in which the foregoing method may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
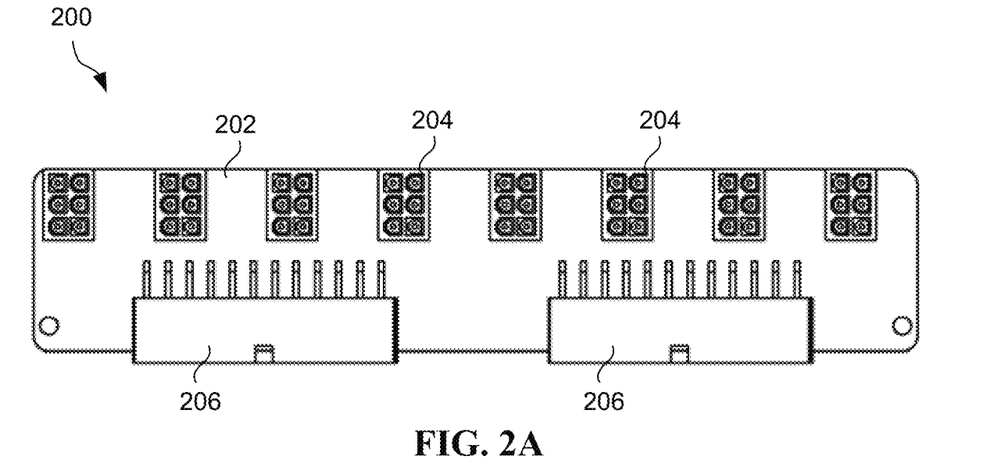
FIG. 2A illustrates a first view of a bus bar, in accordance with one embodiment.

FIG. 2A illustrates a first view of a bus bar 200, in accordance with one embodiment. As an option, the bus bar 200 may be implemented in the context of any one or more of the embodiments set forth in any previous and/or subsequent figure(s) and/or description thereof. Of course, however, the bus bar 200 may be implemented in the context of any desired environment. Further, the aforementioned definitions may equally apply to the description below.

As shown, the bus bar 200 may include a circuit board 202, eight add-in card connectors 204, and two power connectors 206. In one embodiment, four of the add-in card connectors 204 may be connected to a single power connector 206. It is to be appreciated that any number of add-in card connectors may be connected to the circuit board 202. Additionally, although four of the add-in card connectors 204 may be connected to a single power connector 206, it is to be appreciated that any number of add-in card connectors 204 may be connected to a power connector 206, and in one embodiment, the power connector 206 requirements may dictate a number of add-in card connectors 204 to which it can be connected.

The bus bar 200 shows a first view where the eight add-in card connectors 204 and the two power connectors 206 are both on the same side of the circuit board 202. Additionally, the first view shows that the eight add-in card connectors 204 are 6-pin connectors, although any number pin connectors may be used.

Figure 2B:
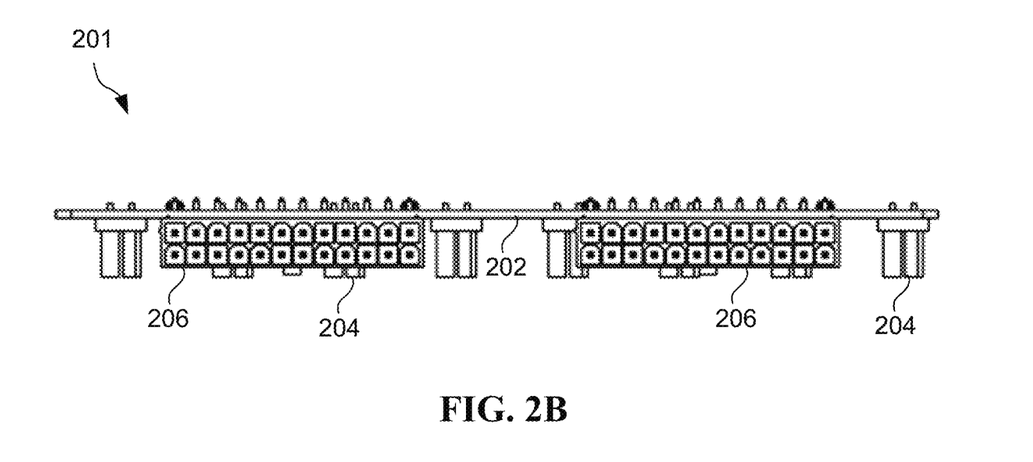
FIG. 2B illustrates a rear-angle view of a bus bar, in accordance with one embodiment.

FIG. 2B illustrates a rear-angle view of a bus bar 201, in accordance with one embodiment. As an option, the bus bar 201 may be implemented in the context of any one or more of the embodiments set forth in any previous and/or subsequent figure(s) and/or description thereof. Of course, however, the bus bar 201 may be implemented in the context of any desired environment. Further, the aforementioned definitions may equally apply to the description below.

As shown, the bus bar 201 may include a circuit board 202, eight add-in card connectors 204, and two power connectors 206. Additionally, the bus bar 201 shows a rear-angle view of the bus bar 200. The rear-angle shows that the power connectors 206 are 24-pin connectors, although any number of power pin connectors may be used.

Figure 2C:
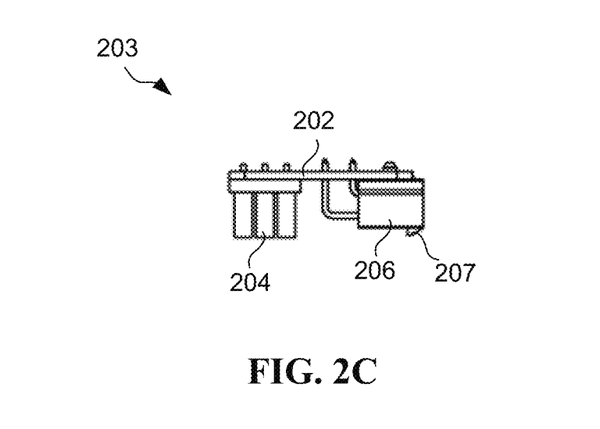
FIG. 2C illustrates a side-profile view of a bus bar, in accordance with one embodiment.

FIG. 2C illustrates a side-profile view of a bus bar 203, in accordance with one embodiment. As an option, the bus bar 203 may be implemented in the context of any one or more of the embodiments set forth in any previous and/or subsequent figure(s) and/or description thereof. Of course, however, the bus bar 203 may be implemented in the context of any desired environment. Further, the aforementioned definitions may equally apply to the description below.

As shown, the bus bar 203 shows a side-profile view of the bus bar 200 and/or the bus bar 201, including mount connector clip 207. Additionally, the bus bar 203 shows that the electrical interface surface mount connector 204 has a greater height than the power connector 206. It is to be appreciated that, in use, the electrical interface surface mount connector 204 may positioned downward and inserted into a female counterpart connector of the add-in card. Additionally, in one embodiment, a soft foam or rubber backing may be added to the bus bar 203 such that a structural component of the chassis may be positioned directly against the soft foam or rubber backing to ensure that the bus bar 203 (and/or add-in cards to which the bus bar 203 is attached) is kept in a stable arrangement, and/or to avoid electrical shorts of the components associated with the bus bar 203 (including the add-in cards to which the bus bar 203 is attached).

Figure 3A:
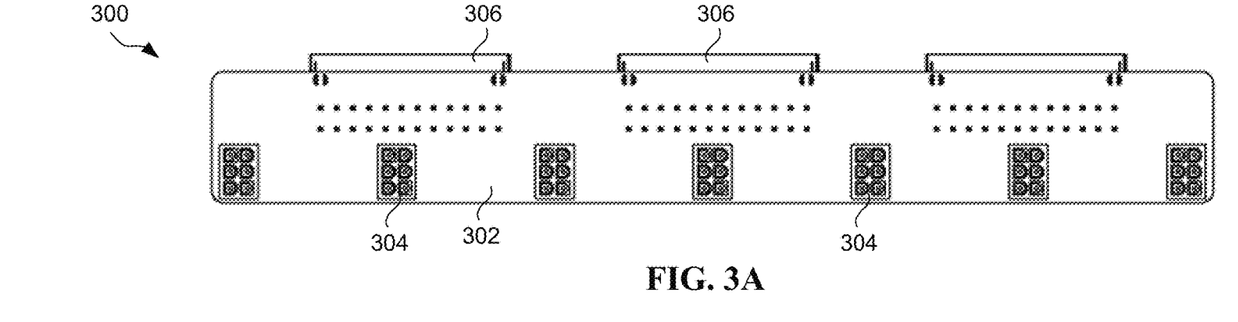
FIG. 3A illustrates a first view of a bus bar, in accordance with one embodiment.

FIG. 3A illustrates a first view of a bus bar 300, in accordance with one embodiment. As an option, the bus bar 300 may be implemented in the context of any one or more of the embodiments set forth in any previous and/or subsequent figure(s) and/or description thereof. Of course, however, the bus bar 300 may be implemented in the context of any desired environment. Further, the aforementioned definitions may equally apply to the description below.

As shown, the bus bar 300 may include a circuit board 302, seven add-in card connectors 304, and three power connectors 306. In one embodiment, four of the add-in card connectors 304 may be connected to a single power connector 306. It is to be appreciated that any number of add-in card connectors may be connected to the circuit board 302. Additionally, although four of the add-in card connectors 304 may be connected to a single power connector 306, it is to be appreciated that any number of add-in card connectors 304 may be connected to a power connector 306, and in one embodiment, the power connector 306 requirements may dictate a number of add-in card connectors 304 to which it can be connected.

The bus bar 300 shows a first view where the seven add-in card connectors 304 are on a first (top) side of the circuit board 302. Additionally, the first view shows that the seven add-in card connectors 304 are 6-pin connectors, although any number pin connectors may be used.

Figure 3B:
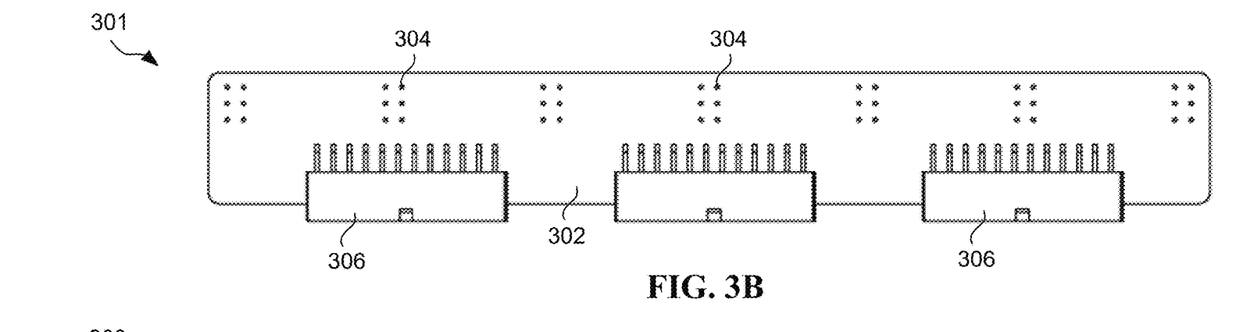
FIG. 3B illustrates a second view of a bus bar, in accordance with one embodiment.

FIG. 3B illustrates a second view of a bus bar 301, in accordance with one embodiment. As an option, the bus bar 301 may be implemented in the context of any one or more of the embodiments set forth in any previous and/or subsequent figure(s) and/or description thereof. Of course, however, the bus bar 301 may be implemented in the context of any desired environment. Further, the aforementioned definitions may equally apply to the description below.

As shown, the bus bar 301 shows a second view where the three power connectors 306 are on a second (bottom) side of the circuit board 302.

Figure 3C:
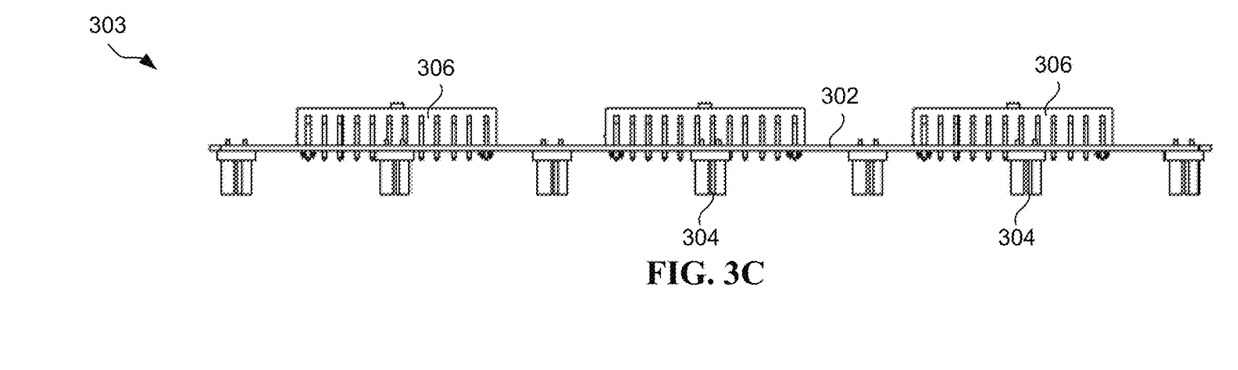
FIG. 3C illustrates a front-angle view of a bus bar, in accordance with one embodiment.

FIG. 3C illustrates a front-angle view of a bus bar 303, in accordance with one embodiment. As an option, the bus bar 303 may be implemented in the context of any one or more of the embodiments set forth in any previous and/or subsequent figure(s) and/or description thereof. Of course, however, the bus bar 303 may be implemented in the context of any desired environment. Further, the aforementioned definitions may equally apply to the description below.

As shown, the bus bar 303 may include a circuit board 302, seven add-in card connectors 304, and three power connectors 306. Additionally, the bus bar 303 shows a front-angle view of the bus bar 300 and/or the bus bar 301, where the seven add-in card connectors 304 are on a first side of the circuit board 302, and the three power connectors 306 are on a second side of the circuit board 302.

Figure 3D:
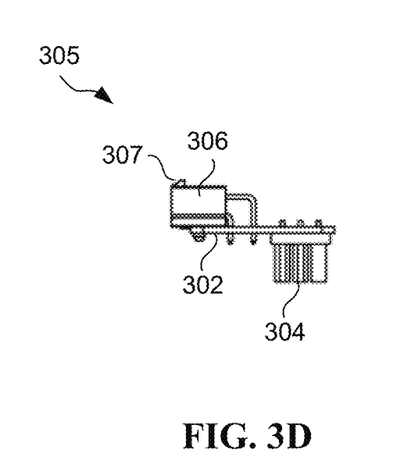
FIG. 3D illustrates a side-profile view of a bus bar, in accordance with one embodiment.

FIG. 3D illustrates a side-profile view of a bus bar 305, in accordance with one embodiment. As an option, the bus bar 305 may be implemented in the context of any one or more of the embodiments set forth in any previous and/or subsequent figure(s) and/or description thereof. Of course, however, the bus bar 305 may be implemented in the context of any desired environment. Further, the aforementioned definitions may equally apply to the description below.

As shown, the bus bar 305 shows a side-profile view of the bus bar 300, the bus bar 301, and/or the bus bar 303, including mount connector clip 307. Additionally, the bus bar 305 shows that the electrical interface surface mount connector 304 is on a first (top) side of the circuit board 302, and the power connector 306 is on a second (bottom) side of the circuit board 302.

It is to be appreciated that any designation of "top" and/or "bottom" as used herein is arbitrary (as the bus bar may be used in a variety of configurations and positions based on the chassis assembly). As such, the terms "top" and/or "bottom" are intended to be construed as signifying a first side of a circuit board, and a second side of the circuit board.

Figure 4A:
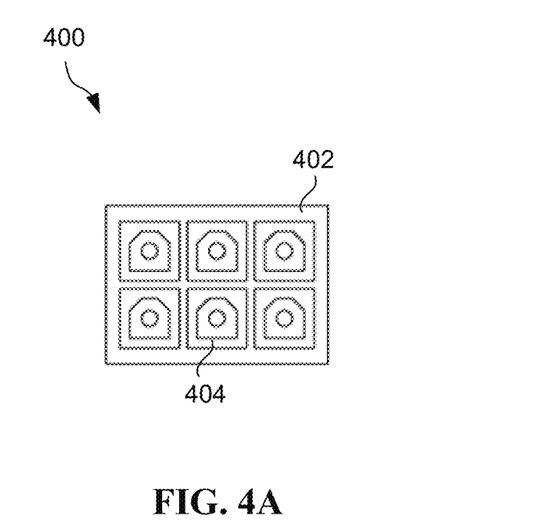
FIG. 4A illustrates a first view of an electrical interface connector, in accordance with one embodiment.

FIG. 4A illustrates a first view of an electrical interface connector 400, in accordance with one embodiment. As an option, the electrical interface connector 400 may be implemented in the context of any one or more of the embodiments set forth in any previous and/or subsequent figure(s) and/or description thereof. Of course, however, the electrical interface connector 400 may be implemented in the context of any desired environment. Further, the aforementioned definitions may equally apply to the description below.

As shown, the electrical interface connector 400 includes a base 402 and interface pins 404. Additionally, the first view shows that the interface pins 404 may include six pins. In alternative embodiments, the number of pins may be four, eight, ten, and/or any number of pins.

Figure 4B:
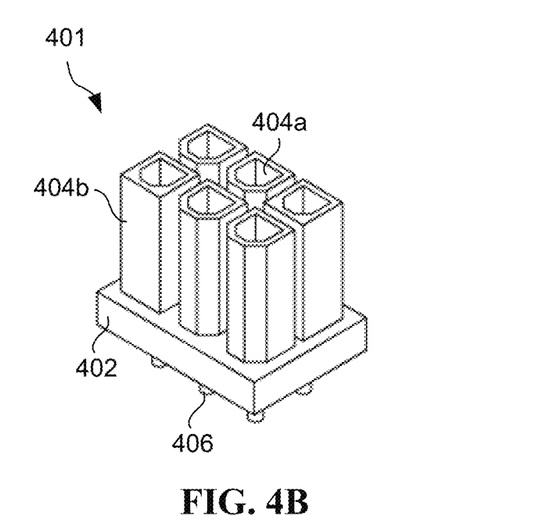
FIG. 4B illustrates an angled-profile view of an electrical interface connector, in accordance with one embodiment.

FIG. 4B illustrates an angled-profile view of an electrical interface connector 401, in accordance with one embodiment. As an option, the electrical interface connector 401 may be implemented in the context of any one or more of the embodiments set forth in any previous and/or subsequent figure(s) and/or description thereof. Of course, however, the electrical interface connector 401 may be implemented in the context of any desired environment. Further, the aforementioned definitions may equally apply to the description below.

As shown, the electrical interface connector 401 includes a base 402, hexagonal-shaped interface pins 404a, a square-shaped interface pin 404b, and output terminals 406. In one embodiment, the hexagonal-shaped interface pins 404a and the square-shaped interface pin 404b may be arranged (within the electrical interface connector 401) based on compatibility requirements (such as ATX compatibility) and/or device (or add-in card) compatibility.

Figure 4C:
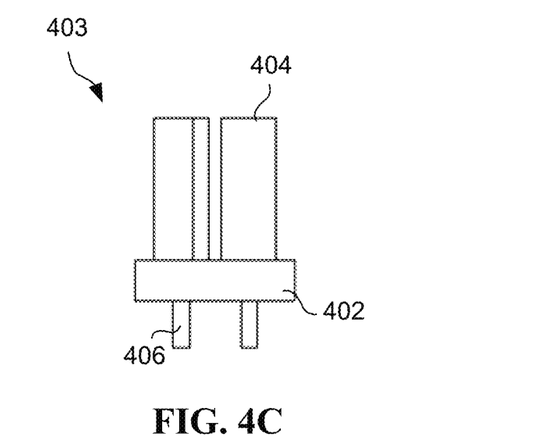
FIG. 4C illustrates a first side-profile view of an electrical interface connector, in accordance with one embodiment.

FIG. 4C illustrates a first side-profile view of an electrical interface connector 403, in accordance with one embodiment. As an option, the electrical interface connector 403 may be implemented in the context of any one or more of the embodiments set forth in any previous and/or subsequent figure(s) and/or description thereof. Of course, however, the electrical interface connector 403 may be implemented in the context of any desired environment. Further, the aforementioned definitions may equally apply to the description below.

As shown, the electrical interface connector 403 includes a base 402, interface pins 404, and output terminals 406. The electrical interface connector 403 shows a first side-profile view of the electrical interface connector 400 and/or the electrical interface connector 401, including two rows of the interface pins 404.

Figure 4D:
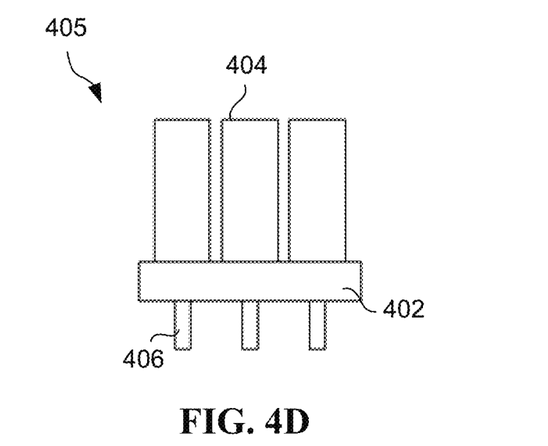
FIG. 4D illustrates a second side-profile view of an electrical interface connector, in accordance with one embodiment.

FIG. 4D illustrates a second side-profile view of an electrical interface connector 405, in accordance with one embodiment. As an option, the electrical interface connector 405 may be implemented in the context of any one or more of the embodiments set forth in any previous and/or subsequent figure(s) and/or description thereof. Of course, however, the electrical interface connector 405 may be implemented in the context of any desired environment. Further, the aforementioned definitions may equally apply to the description below.

As shown, the electrical interface connector 405 includes a base 402, interface pins 404, and output terminals 406. The electrical interface connector 405 shows a second side-profile view of the electrical interface connector 400, the electrical interface connector 401, and/or the electrical interface connector 403, including three rows of the interface pins 404.

Figure 5A:
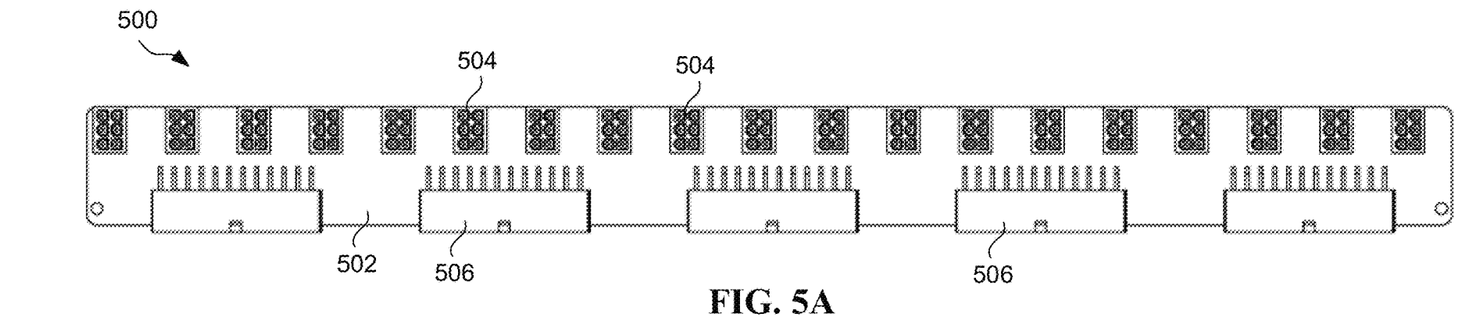
FIG. 5A illustrates a first view of a bus bar, in accordance with one embodiment.

FIG. 5A illustrates a first view of a bus bar 500, in accordance with one embodiment. As an option, the bus bar 500 may be implemented in the context of any one or more of the embodiments set forth in any previous and/or subsequent figure(s) and/or description thereof. Of course, however, the bus bar 500 may be implemented in the context of any desired environment. Further, the aforementioned definitions may equally apply to the description below.

As shown, the bus bar 500 may include a circuit board 502, nineteen add-in card connectors 504, and five power connectors 506. In one embodiment, four of the add-in card connectors 504 may be connected to a single power connector 506. It is to be appreciated that any number of add-in card connectors may be connected to the circuit board 502. Additionally, although four of the add-in card connectors 504 may be connected to a single power connector 506, it is to be appreciated that any number of add-in card connectors 504 may be connected to a power connector 506, and in one embodiment, the power connector 506 requirements may dictate a number of add-in card connectors 504 to which it can be connected.

The bus bar 500 shows a first view where the nineteen add-in card connectors 504 and the five power connectors 506 are both on the same side of the circuit board 502. Additionally, the first view shows that the nineteen add-in card connectors 504 are 6-pin connectors, although any number pin connectors may be used.

Further, it is to be appreciated that any configuration of the add-in card connectors 504 and the power connectors 506 is envisioned. For example, a first number of the add-in card connectors 504 may be found on a first side of the circuit board 502, and a second number of the add-in card connectors 504 may be found on a second side of the circuit board 502.

Figures 5B, 5C:
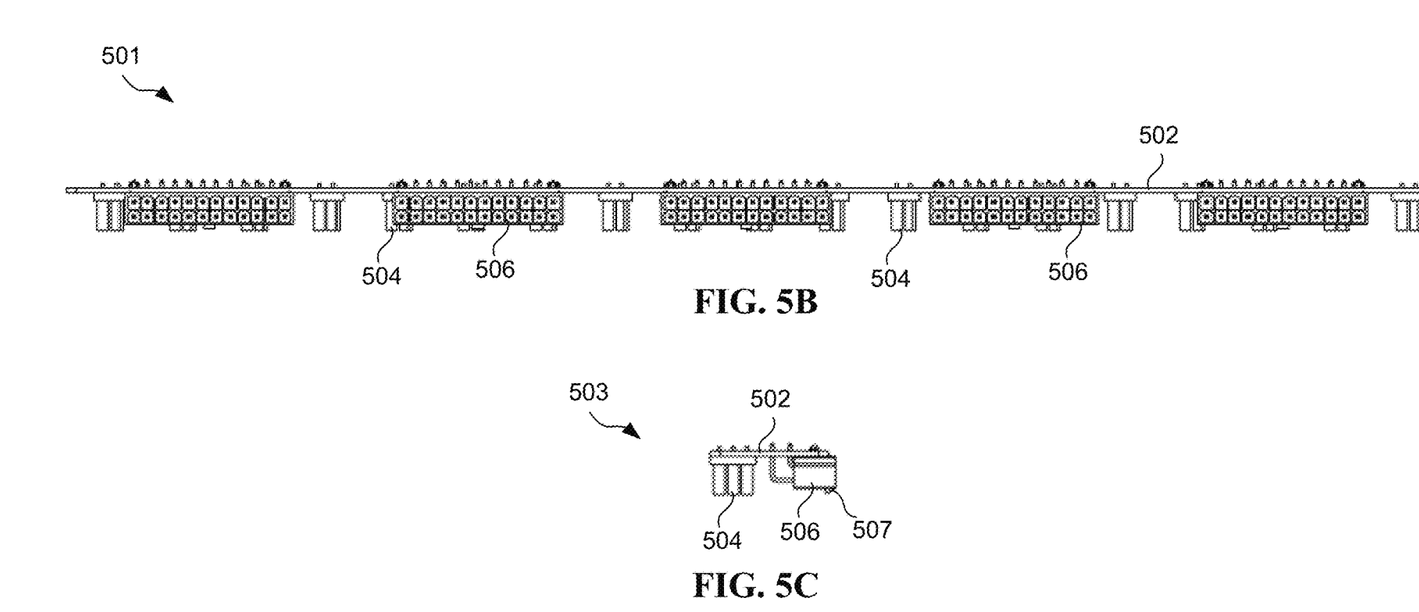
FIG. 5B illustrates a rear-angle view of a bus bar, in accordance with one embodiment.
FIG. 5C illustrates a side-profile view of a bus bar, in accordance with one embodiment.

FIG. 5B illustrates a rear-angle view of a bus bar 501, in accordance with one embodiment. As an option, the bus bar 501 may be implemented in the context of any one or more of the embodiments set forth in any previous and/or subsequent figure(s) and/or description thereof. Of course, however, the bus bar 501 may be implemented in the context of any desired environment. Further, the aforementioned definitions may equally apply to the description below.

As shown, the bus bar 501 may include a circuit board 502, nineteen add-in card connectors 504, and five power connectors 506. Additionally, the bus bar 501 shows a rear-angle view of the bus bar 500. The rear-angle shows that the power connectors 506 are 24-pin connectors, although any number of power pin connectors may be used.

FIG. 5C illustrates a side-profile view of a bus bar 503, in accordance with one embodiment. As an option, the bus bar 503 may be implemented in the context of any one or more of the embodiments set forth in any previous and/or subsequent figure(s) and/or description thereof. Of course, however, the bus bar 503 may be implemented in the context of any desired environment. Further, the aforementioned definitions may equally apply to the description below.

As shown, the bus bar 503 shows a side-profile view of the bus bar 500 and/or the bus bar 501, which also displays that the add-in card connectors 504 and power connectors 506 are on the same side of the circuit board 502. Additionally, mount connector clip 507 is shown. In another embodiment (as also shown herein with respect to FIGS. 3A-3D), it is envisioned that the add-in card connectors 504 may be found on a first side of the circuit board 502, and the power connectors 506 may be found on a second side of the circuit board 502.

Figure 6:
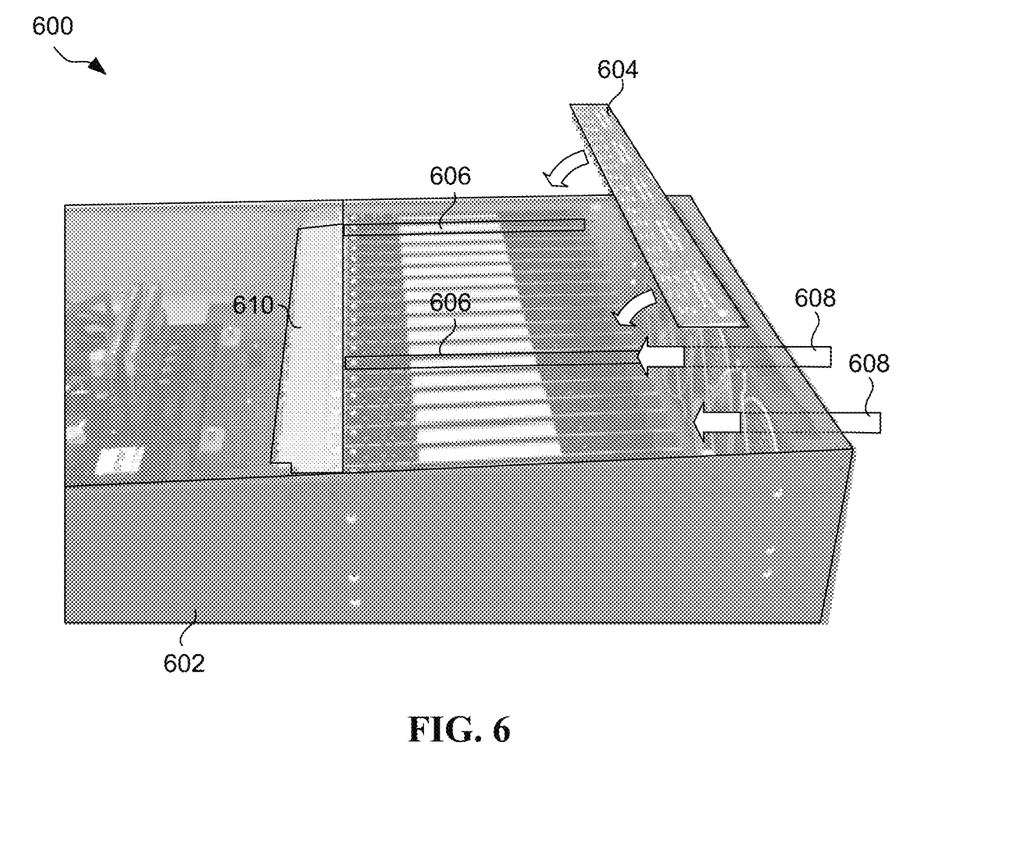
FIG. 6 illustrates a system including the bus bar and add-in cards in a 3 U chassis, in accordance with one embodiment.

FIG. 6 illustrates a system 600 including the bus bar and add-in cards in a 3 U chassis, in accordance with one embodiment. As an option, the system 600 may be implemented in the context of any one or more of the embodiments set forth in any previous and/or subsequent figure(s) and/or description thereof. Of course, however, the system 600 may be implemented in the context of any desired environment. Further, the aforementioned definitions may equally apply to the description below.

As shown, the system 600 includes a chassis 602, a power distribution bus bar 604, and add-in cards 606. Additionally, the system 600 may be configured to allow air flow 608 to enter the chassis 602 by intake fans. The fan assembly 610 may assist with pulling the heat from the add-in cards 606 and directing the air flow back out of the chassis 602. The system 600 is shown without a top cover such that the inner components may more clearly be displayed.

As shown by the arrows below the power distribution bus bar 604, the bus bar may be attached to the add-in cards 606.

Any number of add-in cards 606 may be included in the chassis 602, and the maximum number be dictated by the size of the chassis 602.

Additionally, the power distribution bus bar 604 may be segmented into multiple bus bars, each of which may be attached to a minimum of two add-in cards 606. Multiple bus bars may be attached to each other such that power distribution may be directed from one bus bar to another.

In various embodiments, the bus bar may be used to provide power to multiple add-in cards in a 3 U (or potentially even smaller chassis size) rack mount server chassis. In addition, by replacing power cables with a bus bar, airflow may be increased which is critical to the overall function of the appliance (including the chassis and internal components).

Use of the bus bar may also assist in preventing shift and movement of the add-in cards during shipping and use. For example, in conventional systems, add-in cards connected with cables may exhibit movement that can affect durability, function, and cycle time. The present disclosure avoids such problems in that the bus bar may not only be used to distribute power to multiple add-in cards, but may also be used to secure the add-in cards so that movement is minimized.

In various configurations, the bus bar may be connected in series via various ATX compatible connectors. For example, a bus bar may include two surface mounted connectors along with one single right angle connector (such as 6-pin connector). In this configuration there may be one or more bus bars that may provide support up to 20 add-in cards. Use of the bus bar may increase the ease of swapping out add-in cards (for different use case scenarios or maintenance). Instead of having to remove a cable to each of the 20 add-in cards in order to service or replace a single card, the bus bar (one unit) may be removed, thereby allowing access to all (or a portion if the bus bars are configured in series) of the add-in cards.

Of course, it is to be appreciated that the bus bar may be of various sizes and configurations.

Figure 7A:
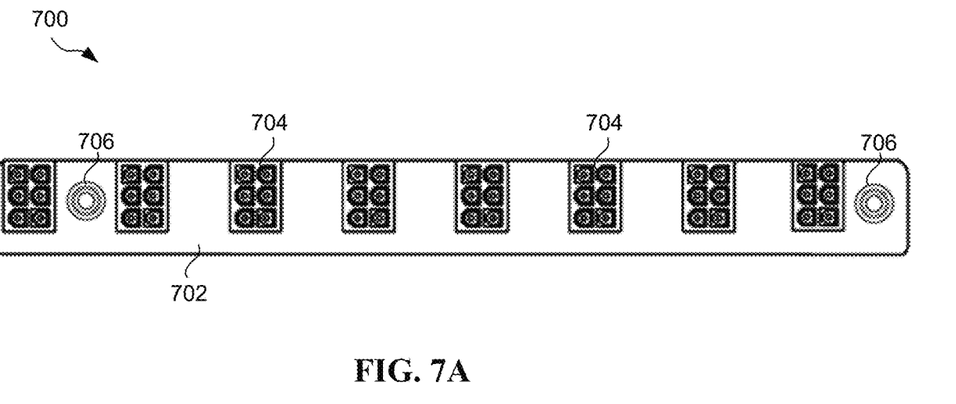
FIG. 7A illustrates an add-on bus bar, in accordance with one embodiment.

FIG. 7A illustrates an add-on bus bar 700, in accordance with one embodiment. As an option, the bus bar 700 may be implemented in the context of any one or more of the embodiments set forth in any previous and/or subsequent figure(s) and/or description thereof. Of course, however, the bus bar 700 may be implemented in the context of any desired environment. Further, the aforementioned definitions may equally apply to the description below.

As shown, the add-on bus bar 700 may include a circuit board 702, eight add-in card connectors 704, and at least two panel mount connectors 706. In one embodiment, the add-on bus bar 700 may include up to nineteen add-in card connectors 704. In another embodiment, the number of permitted add-in card connectors 704 may be dictated by power capabilities of the panel mount connector 706 and/or the power capabilities of the bus bar (or another PCB) to which the add-on bus bar 700 may be connected. Additionally, the at least two panel mount connectors 706 may include a first panel mount connector as a positive terminal, and a second panel mount connector as a negative terminal.

The add-on bus bar 700 shows a first view where the eight add-in card connectors 704 are 6-pin connectors, although any number pin connectors may be used. In one embodiment, the at least two panel mount connectors 706 may include a right-angle PCB mounted connector, although it is envisioned that any power circuit board connector that may be used to connect two circuit boards (or PCBs) may be used.

In some embodiments, two or more bus bars may be connected in series to provide power to more than one location with respect to the add-in cards. For example, a FPGA card may require power in two or more locations along the top edge of the FPGA card (with advantages such as load balancing to the processor).

In one embodiment, the at least two panel mount connectors 706 may each include a Molex™ connector (such as the Coeur CST High-Current Interconnect system) which delivers between 30 and 200 AMPs.

Figure 7B:
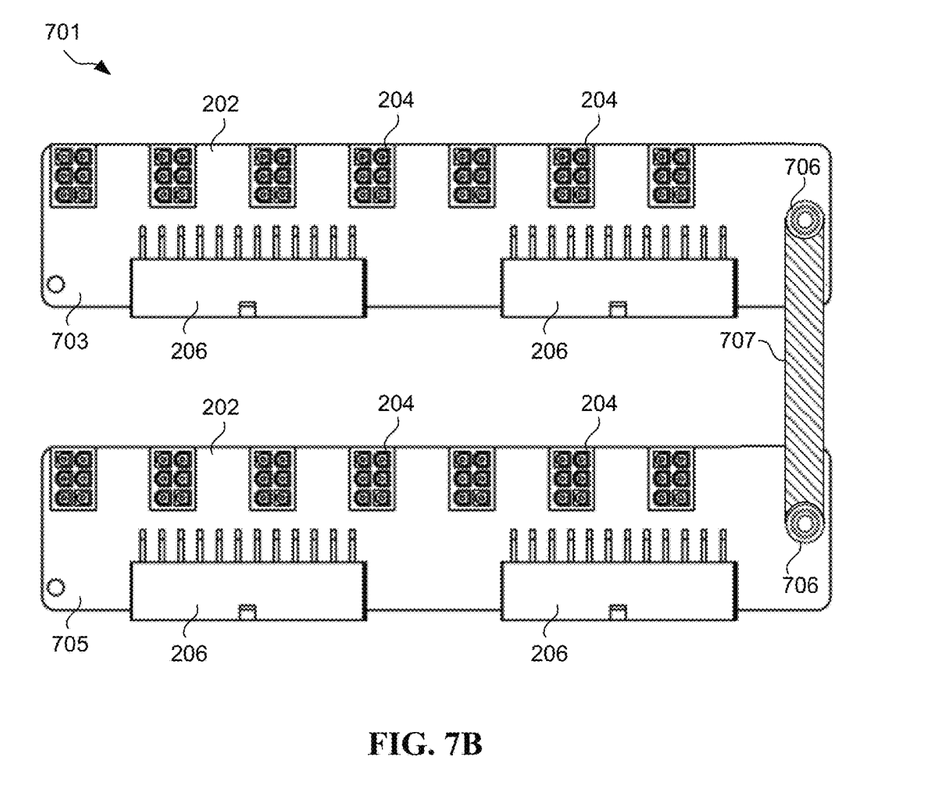
FIG. 7B illustrates an add-on bus bar, in accordance with one embodiment.

FIG. 7B illustrates an add-on bus bar 701, in accordance with one embodiment. As an option, the bus bar 701 may be implemented in the context of any one or more of the embodiments set forth in any previous and/or subsequent figure(s) and/or description thereof. Of course, however, the bus bar 701 may be implemented in the context of any desired environment. Further, the aforementioned definitions may equally apply to the description below.

In the context having multiple bus bars, a first cable would connect a first bus bar 703 to a riser board (to which the add-in cards are affixed), which in turn would be connected via a second cable 707 (location of the mounts connecting to the second cable 707 shown is arbitrary) to a second bus bar 705. The first cable and/or second cable (or any number based on the number of bus bars that are being connected) may be used to power the respective bus bar, which in turn may power the add-in cards. Further, multiple bus bars may be connected by another bus bar.

Figure 7C:
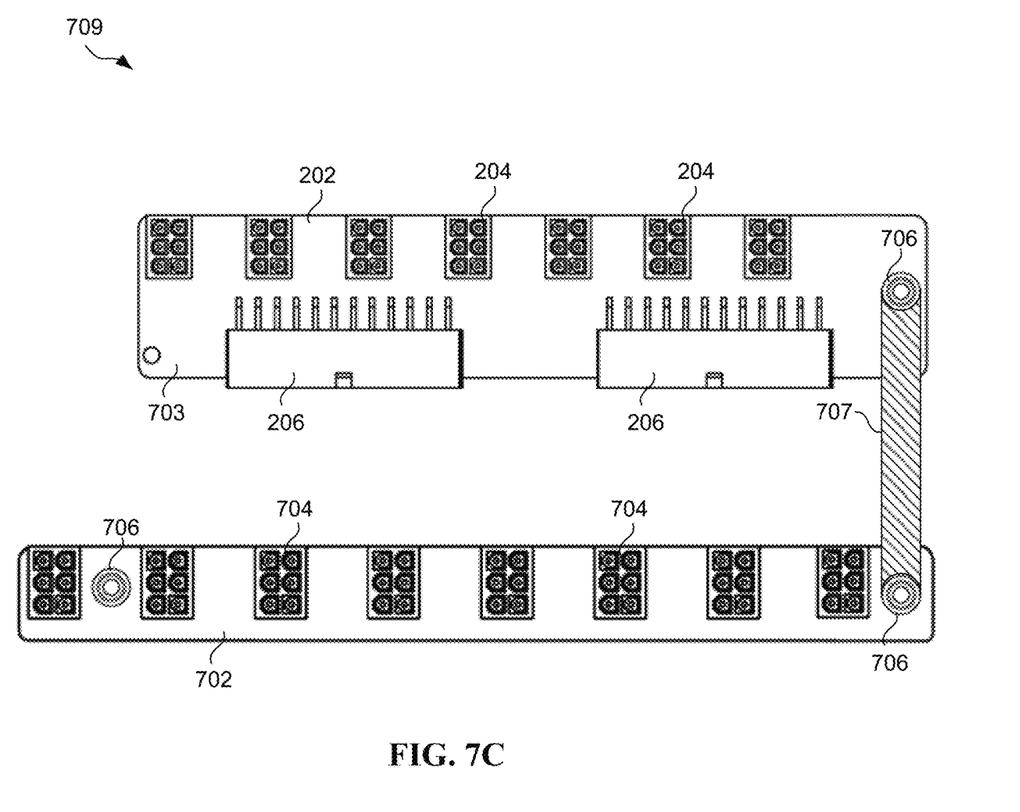
FIG. 7C illustrates an add-on bus bar, in accordance with one embodiment.

FIG. 7C illustrates an add-on bus bar 709, in accordance with one embodiment. As an option, the bus bar 709 may be implemented in the context of any one or more of the embodiments set forth in any previous and/or subsequent figure(s) and/or description thereof. Of course, however, the bus bar 709 may be implemented in the context of any desired environment. Further, the aforementioned definitions may equally apply to the description below.

As shown, a first bus bar 703 is connected via a panel mount connector 706 and a second cable 707 (location of the mounts connecting to the second cable 707 shown is arbitrary) to an add-on bus bar comprising the circuit board 702, and add-in card connectors 704.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

Additionally, it should be noted that the add-in card connectors (including, for example, add-in card connectors 104, 204, 304, 504, 704; also shown in FIGS. 4A-4D) were expressly created for purposes of use with the power distribution bus bar. Unlike conventional 6 or 8 pin connectors used within the industry, the add-in card connectors described herein did not exist in industry and were developed expressly for the functionality of the power distribution bus bar. Prior to development of the power distribution bus bar, there were no connectors available in industry which would allow multiple add-in cards to fit into a 3 U chassis.

Further, in various embodiments, the circuit board 102 may be used to receive the power supply from the at least one power connector 106 and provide the power supply to the at least two add-in card connectors. In one embodiment, the circuit board 102 may include specific electrically conductive material connecting the at least one power connector 106 (or elements of the at least one power connector 106) to each of the add-in card connectors 104 (or elements of each of the add-in card connectors 104).

In another embodiment, the power distribution bus bar may be used to significantly reduce the amount of space required to connect a power source to an add-in card. For example, in conventional systems, a cable may be used to connect a video graphics card to a power source. However, if a chassis included many graphic cards (or any other type of add-in card), the amount of space required increases due to the sheer number of conventional cables that are used to power individually each graphics card. In the present description, the power distribution bus bar may be used to eliminate the conventional use of cables to provide power to each graphics card (or any other type of add-in card). Rather, the power distribution bus bar may receive power via one power input and distribute such power to multiple graphics cards, thereby removing the need for individual cables powering each graphics card, providing a way to securely fasten the add-in cards to a chassis (e.g. the power distribution bus bar can be used to securely restrict the add-in card within a chassis), and significantly reducing the amount of space required in the space to provide power to each add-in card (i.e. the power distribution bus bar takes up significantly less space than individual cables). In some embodiments, the power-distribution bus bar may allow for small-form factor such that a normal chassis 3 U size of 5.25 inches height may be reduced to a 2 U (3.5 inches height), a 1 U (1.75 inches height), or potentially even smaller.

In another embodiment, the power distribution bus bar may be composed of one (a single) low profile add-in card connector that may connect to additional single connector bus bars in parallel via power connectors running collinear to the individual bus bars, thereby forming a chain of individual circuit boards each with one of the low profile add-in card connectors connected to traces that connect to wires to provide power to one or more add-in cards.

For example, one or more of these system components (and means) may be realized, in whole or in part, by at least some of the components illustrated in the arrangements illustrated in the described Figures.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

The embodiments described herein included the one or more modes known to the inventor for carrying out the claimed subject matter. Of course, variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A power distribution bus bar of a single computing system, comprising:
   a circuit board for connecting board mounted components;
   at least two add-in card connectors each mounted to a first surface of the circuit board; and
   at least one power supply connector distributing a power supply to the at least two add-in card connectors, wherein the at least one power supply connector is mounted to a second surface opposite to the first surface of the circuit board and connected to the at least two add-in card connectors,
   wherein the at least two add-in card connectors are configured to directly distribute the power supply to at least two add-in cards;
   wherein the circuit board is configured to connect to each of the power supply and to the at least two add-in cards via a cableless connection, and
   wherein the circuit board is used only to distribute the power supply from the at least one power supply connector to the at least two add-in card connectors.

2. The power distribution bus bar of claim 1, wherein the circuit board is configured for at least one of a 1 rack unit (U) of 1.75 inches height chassis configuration, a 2U of 3.5 inches height chassis configuration, or a 3U of 5.25 inches height chassis configuration.

3. The power distribution bus bar of claim 1, wherein at least one of the at least two add-in card connectors includes at least one of a 6-pin connector, an 8-pin connector, a peripheral component interconnect express (PCIe) connector, a M.2 PCIe 4x express connection, or an in slot connector.

4. The power distribution bus bar of claim 1, wherein the at least two add-in card connectors are attached to the circuit board without mechanical fasteners or clips.

5. The power distribution bus bar of claim 1, wherein the at least two add-in card connectors include at least seven add-in card connectors.

6. The power distribution bus bar of claim 1, further comprising at least one of mechanical fasteners or clips for at least one of securing the bus bar to a chassis or securing a respective add-in card associated with each of the at least two add-in card connectors.

7. The power distribution bus bar of claim 1, wherein the at least one power connector includes a 12-volt connector.

8. The power distribution bus bar of claim 1, wherein the at least one power connector includes a 24-pin power connector.

9. The power distribution bus bar of claim 1, wherein the at least two add-in cards include at least one of a processor, a central processing unit (CPU), a field programmable gate array (FPGA), a graphics processing unit (GPU), a hard drive, a solid state drive (SSD), an application specific integrated circuit (ASIC), a system on a chip (SoC), or an application-specific standard product (ASSP).

10. The power distribution bus bar of claim 1, wherein the circuit board is a printed circuit board (PCB).

11. The power distribution bus bar of claim 1, further comprising a respective add-in card associated with each of the at least two add-in card connectors is at least one of Advanced Technology eXtended (ATX) compatible or peripheral component interconnect express (PCIe) compatible.

12. The power distribution bus bar of claim 1, wherein the at least one power connector is configured to a particular at least one of voltage, impedance, or current.

13. The power distribution bus bar of claim 1, wherein each of the at least two add-in card connectors distribute the power supply to a respective add-in card.

14. The power distribution bus bar of claim 1, wherein the at least one power supply connector receives the power supply.

15. The power distribution bus bar of claim 1, further comprising a structural component of the single computing system to secure the bus bar to a chassis of the single computing system.

16. The power distribution bus bar of claim 1, wherein the cableless connection increases airflow within a chassis of the single computing system.

17. The power distribution bus bar of claim 8, wherein the 24-pin power connector is connected to a maximum of four add-in card connectors of the at least two add-in card connectors.

18. The power distribution bus bar of claim 13, wherein the respective add-card is secured, without cables, to the power distribution bus bar.

* * * * *